US012635197B2

(12) United States Patent
Thomas et al.

(10) Patent No.: US 12,635,197 B2
(45) Date of Patent: May 19, 2026

(54) UNIFORM EPITAXIAL GROWTH OVER CRYSTALLINE TEMPLATE

(71) Applicant: Applied Materials, Inc., Santa Clara, CA (US)

(72) Inventors: Shawn Thomas, Chesterfield, MO (US); Saurabh Chopra, Santa Clara, CA (US); John Tolle, Gilbert, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 608 days.

(21) Appl. No.: 17/943,137

(22) Filed: Sep. 12, 2022

(65) Prior Publication Data

US 2024/0088222 A1 Mar. 14, 2024

(51) Int. Cl.
H10D 62/13 (2025.01)
C23C 16/22 (2006.01)
(Continued)

(52) U.S. Cl.
CPC .......... H10D 62/151 (2025.01); C23C 16/22 (2013.01); C23C 16/56 (2013.01);
(Continued)

(58) Field of Classification Search
CPC .. H10D 62/151; H10D 30/014; H10D 64/017; H10D 64/018; H10D 30/43;
(Continued)

(56) References Cited

U.S. PATENT DOCUMENTS 6,569,715 B1 5/2003 Forbes
2013/0140576 A1 6/2013 Mieno et al.
(Continued)

FOREIGN PATENT DOCUMENTS

CN 113889436 A 1/2022
JP 2003-008008 A 1/2003
(Continued)

OTHER PUBLICATIONS

International Search Report dated Jul. 24, 2023 for application No. PCT/US2023/017429.
(Continued)

*Primary Examiner* — Julia Slutsker
(74) *Attorney, Agent, or Firm* — Patterson + Sheridan, LLP

(57) ABSTRACT

A processing system includes one or more processing chambers, and a system controller configured to cause the processing system to perform (a) a pre-clean process on exposed surfaces of a semiconductor structure, the semiconductor structure comprising a first semiconductor region, a second semiconductor region separated from the first semiconductor region by a trench, and a dielectric layer over at least a portion of the first semiconductor region and the second semiconductor region, (b) a first deposition process to form an amorphous silicon-containing layer on the exposed surfaces of the semiconductor structure, (c) a recrystallization anneal process to recrystallize at least a portion of the amorphous silicon-containing layer to form a silicon-containing crystalline layer within the trench, (d) an etch process to remove remaining portions of the amorphous silicon-containing layer, and (e) a second deposition process, to epitaxially form a source/drain region over the silicon-containing crystalline layer within the trench.

14 Claims, 9 Drawing Sheets

(51) Int. Cl.

| | |
|---|---|
| *C23C 16/56* | (2006.01) |
| *H01L 21/02* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC .. *H01L 21/02532* (2013.01); *H01L 21/02576* (2013.01); *H01L 21/02579* (2013.01); *H01L 21/02592* (2013.01); *H01L 21/02598* (2013.01); *H01L 21/02661* (2013.01); *H01L 21/02672* (2013.01); *H01L 21/02675* (2013.01); *H10D 30/014* (2025.01); *H10D 64/017* (2025.01); *H10D 64/018* (2025.01); *H10D 30/43* (2025.01); *H10D 30/6735* (2025.01); *H10D 30/6757* (2025.01); *H10D 62/121* (2025.01)

(58) Field of Classification Search
CPC ............ H10D 30/6735; H10D 30/6757; H01L 21/02592; H01L 21/02598; H01L 21/02672; H01L 21/02507; H01L 21/02667; H01L 21/67069; H01L 21/0245; H01L 21/0262
See application file for complete search history.

(56) References Cited

U.S. PATENT DOCUMENTS

| | | | |
|---|---|---|---|
| 2018/0308758 A1* | 10/2018 | Willemann ........... | H04L 51/046 |
| 2019/0252260 A1* | 8/2019 | Reznicek .......... | H01L 21/02667 |
| 2020/0052120 A1 | 2/2020 | Colinge et al. | |
| 2020/0350215 A1* | 11/2020 | Zhang ................... | H10D 62/40 |
| 2021/0288166 A1 | 9/2021 | Huang et al. | |
| 2022/0059703 A1 | 2/2022 | More | |

FOREIGN PATENT DOCUMENTS

| | | | |
|---|---|---|---|
| JP | 2017-162851 | A | 9/2017 |
| JP | 2019-500756 | A | 1/2019 |
| JP | 2022-22169 | A | 2/2022 |
| KR | 20070034651 | A | 3/2007 |
| KR | 20120127009 | A | 11/2012 |

OTHER PUBLICATIONS

Korean Office Action dated Nov. 11, 2025 for Application No. 10-2025-7011941.
Japanese Office Action for Application No. 2025-514089 dated Feb. 17, 2026.

* cited by examiner

UNIFORM EPITAXIAL GROWTH OVER CRYSTALLINE TEMPLATE

BACKGROUND

Field

Embodiments described herein generally relate to semiconductor device fabrication, and more particularly, to systems and methods of uniform epitaxial growth within a semiconductor structure.

Description of the Related Art

Multi-gate metal-oxide-semiconductor field-effect transistors (MOSFETs), such as double-gate field-effect transistors (FinFETs), silicon-on-insulator (SOI) tri-gate MOSFETs, and gate all around (GAA) FETs, that incorporate more than one gate into a single device and are thus more scalable than the conventional planar bulk MOSFET, pose challenges in manufacturability due to their three-dimensional (3D) designs and small sizes. In architectures for sub 10-15 nm technology nodes, such as GAA FETs, in which a gate is placed on two or all four sides of a silicon-based channel, parasitic or external resistance significantly impacts device performance. In such devices, a source/drain region may be formed within a trench by an epitaxy process. However, increased variation of critical dimension (e.g., line width) have been observed in such devices, due to inner surfaces of the trench having different materials (e.g., silicon (Si) and silicon nitride ($Si_3N_4$)) during the epitaxy process. This non-uniformity leads to varying growth rates over the inner surfaces of the trench in the epitaxy process and thus to forming defects such as twins, stacking faults, or voids in the source/drain region. The presence of defects in source/drain regions can drastically increase contact resistance.

Therefore, there is a need for methods and systems that can form a uniform epitaxial source/drain region.

SUMMARY

Embodiments of the present disclosure provide a processing system. The processing system includes one or more processing chambers, and a system controller configured to cause the processing system to perform, in the one or more processing chambers, (a) a pre-clean process on exposed surfaces of a semiconductor structure, the semiconductor structure comprising a first semiconductor region, a second semiconductor region separated from the first semiconductor region by a trench, and a dielectric layer over at least a portion of the first semiconductor region and the second semiconductor region, (b) a first deposition process to form an amorphous silicon-containing layer on the exposed surfaces of the semiconductor structure, (c) a recrystallization anneal process to recrystallize at least a portion of the amorphous silicon-containing layer to form a silicon-containing crystalline layer within the trench, (d) an etch process to remove remaining portions of the amorphous silicon-containing layer, and (e) a second deposition process, to epitaxially form a source/drain region over the silicon-containing crystalline layer within the trench.

Embodiments of the present disclosure provide a method of filling a trench in a semiconductor structure. The method includes performing a first deposition process to form an amorphous silicon-containing layer on exposed surfaces of a semiconductor structure, the semiconductor structure comprising a first semiconductor region, a second semiconductor region separated from the first semiconductor region by a trench, and a dielectric layer over at least a portion of the first semiconductor region and the second semiconductor region, performing a recrystallization anneal process to recrystallize at least a portion of the amorphous silicon-containing layer to form a silicon-containing crystalline layer within the trench, performing an etch process to remove remaining portions of the amorphous silicon-containing layer, and performing a second deposition process, to epitaxially form a source/drain region over the silicon-containing crystalline layer within the trench.

Embodiments of the present disclosure provide a method of filling a trench in a semiconductor structure. The method includes performing a pre-clean process on exposed surfaces of a semiconductor structure, the semiconductor structure comprising a first semiconductor region, a second semiconductor region separated from the first semiconductor region by a trench, and a dielectric layer over at least a portion of the first semiconductor region and the second semiconductor region, performing a first deposition process to form an amorphous silicon-containing layer on the exposed surfaces of the semiconductor structure, performing a recrystallization anneal process to recrystallize at least a portion of the amorphous silicon-containing layer to form a silicon-containing crystalline layer within the trench, performing an etch process to remove remaining portions of the amorphous silicon-containing layer, and performing a second deposition process, to epitaxially form a source/drain region over the silicon-containing crystalline layer within the trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide methods and systems for epitaxial growth to fill a trench in a semiconductor structure. The methods and systems may be particularly useful for forming a source/drain region in a trench, in gate all around (GAA) FETs. Unlike conventional processes that require epitaxial growth of a source/drain region over rough surfaces of a trench, embodiments described herein include epitaxial growth of a source/drain region over a crystalline template formed on the surfaces of the trench. Thus, the formed source/drain region is uniform having high quality without defects or voids.

Figure 1:
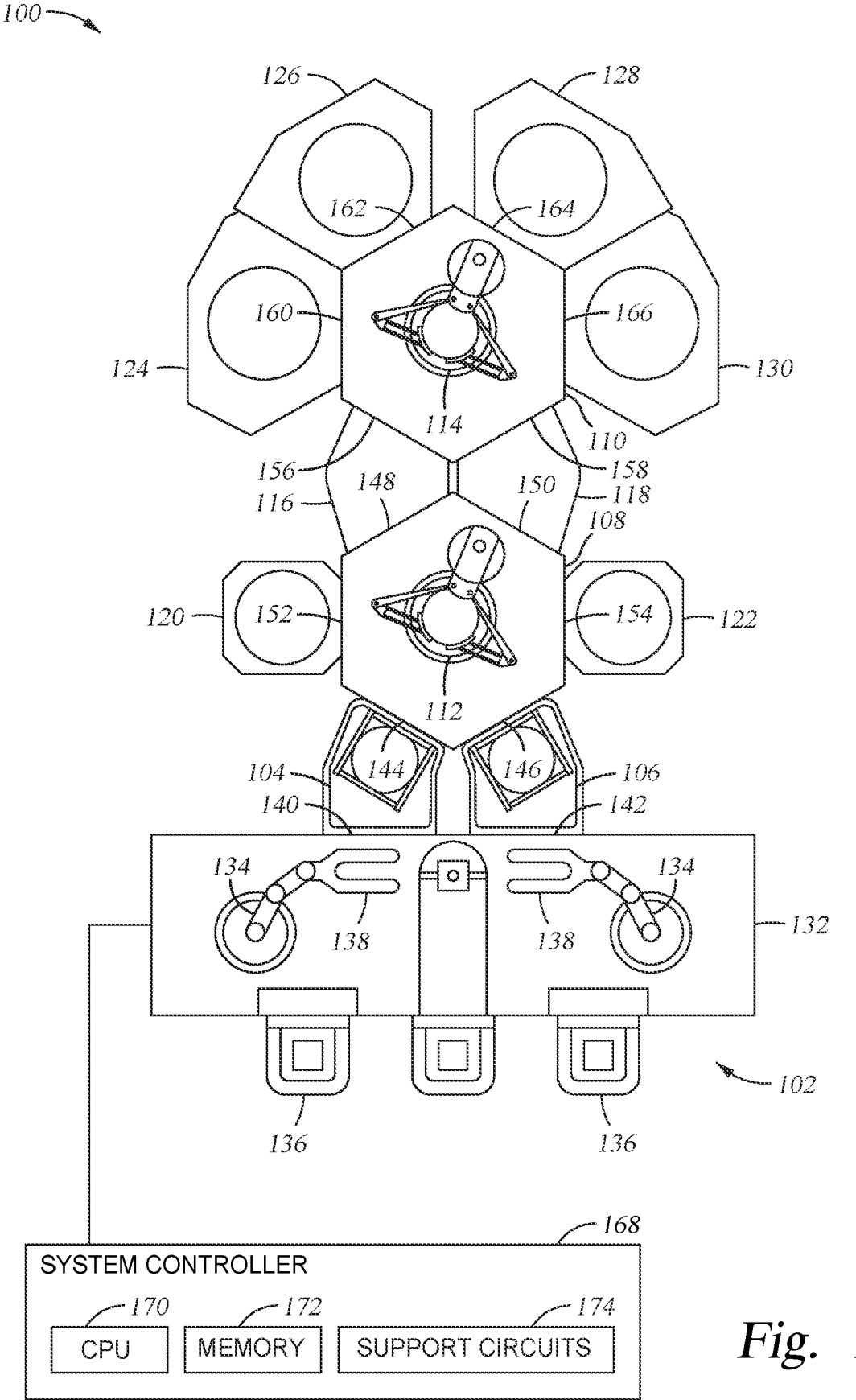
FIG. 1 is a schematic top view of a multi-chamber processing system according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, the processing chamber 124 can be capable of performing a selective removal process, and the processing chambers 126, 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126, 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2A:
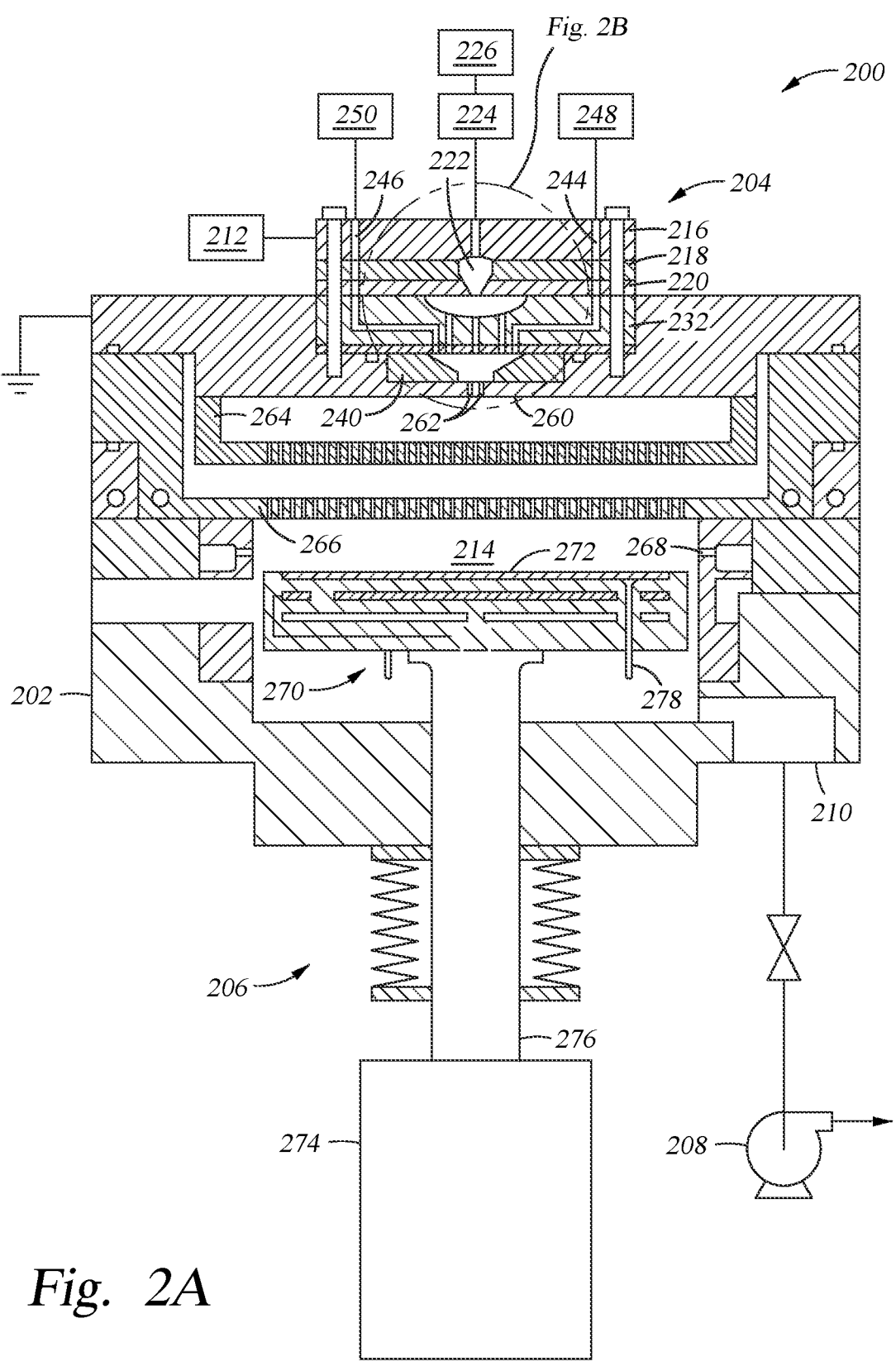
FIG. 2A is a cross sectional view of a processing chamber, according to one or more embodiments.
Figure 2B:
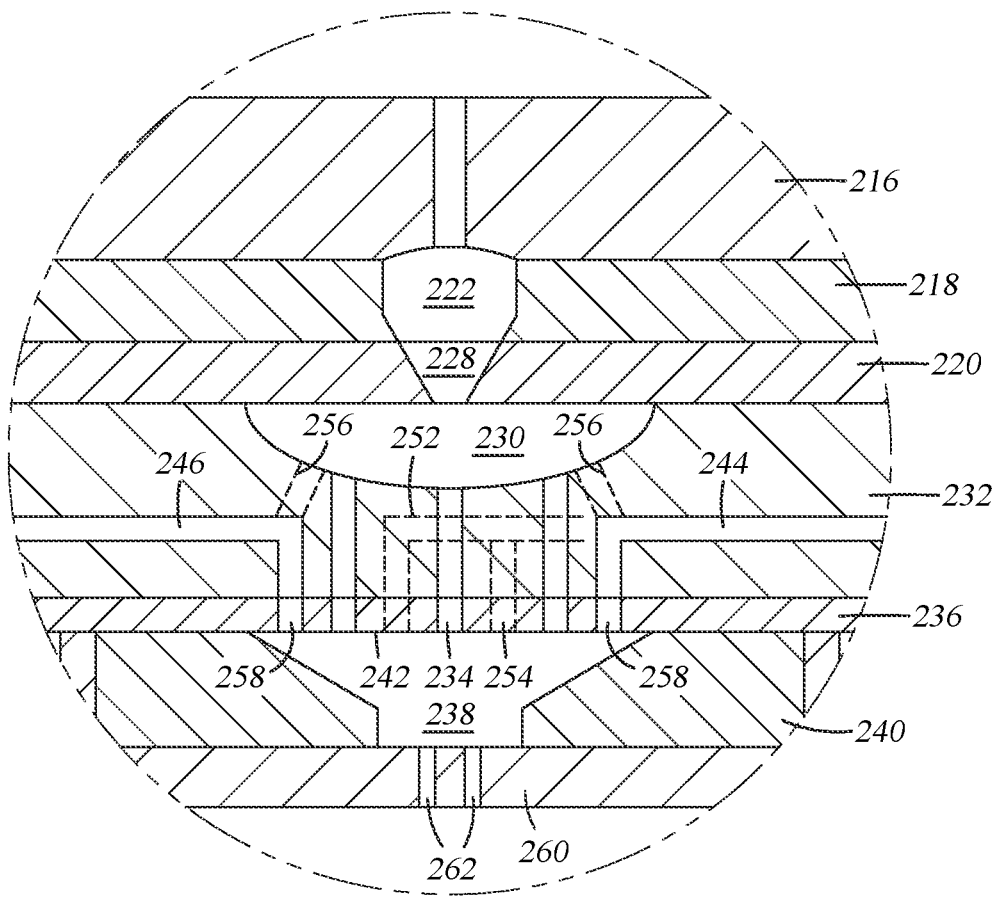
FIG. 2B is an enlarged view of a portion of the processing chamber of FIG. 2A.

FIG. 2A is a cross sectional view of a processing chamber 200, according to one or more embodiments, that is adapted to perform a pre-clean process as detailed below. The processing chamber 200 may be the processing chamber 122 shown in FIG. 1. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 202, a lid assembly 204, and a support assembly 206. The lid assembly 204 is disposed at an upper end of the chamber body 202, and the support assembly 206 is at least partially disposed within the chamber body 202. A vacuum system can be used to remove gases from processing chamber 200. The vacuum system includes a vacuum pump 208 coupled to a vacuum port 210 disposed in the chamber body 202. The processing chamber 200 also includes a controller 212 for controlling processes within the processing chamber 200.

The lid assembly 204 includes stacked components adapted to provide precursor gases and/or a plasma to a processing region 214 within the processing chamber 200. A first plate 216 is coupled to a second plate 218. A third plate 220 is coupled to the second plate 218. The lid assembly 204 may be connected to a power source (not shown) for supplying a plasma to a cone-shaped chamber 222 formed in the lid assembly 204. The lid assembly 204 can also be connected to a remote plasma source 224 that creates the plasma upstream of the lid stack. The remote plasma cavity (e.g., the processing region 214, the first plate 216, and the second plate 218 in FIGS. 2A-2B) is coupled to a gas source 226 via the remote plasma source 224 (or the gas source 226 is coupled directly to the lid assembly 204 in the absence of the remote plasma source 224). The gas source 226 may include a gas source that is adapted to provide helium, argon, or other inert gas. In some configurations, the gas provided by the gas source 226 can be energized into a plasma that is provided to the lid assembly 204 by use of the remote plasma source 224. In alternate embodiments, the gas source 226 may provide process gases that can be activated by the remote plasma source 224 prior to being introduced to a surface of the substrate that is disposed within the processing chamber 200. Referring to FIG. 2B, the cone-shaped chamber 222 has an opening 228 that allows a formed plasma to flow from the remote plasma source 224 to a volume 230 formed in a fourth plate 232 of the lid assembly 204.

In some configurations of the lid assembly 204, a plasma is generated within the cone-shaped chamber 222 by the application of energy delivered from a plasma source. In one example, the energy can be provided by biasing the lid assembly 204 to capacitively couple RF, VHF and/or UHF energy to the gases positioned in the cone-shaped chamber 222. In this configuration of the lid assembly 204, the remote plasma source 224 may not be used, or not be installed within the lid assembly 204.

A central conduit 234, which is formed in the fourth plate 232, is adapted to provide the plasma generated species provided from the volume 230 through a fifth plate 236 to a mixing chamber 238 formed in a sixth plate 240 of the lid assembly 204. The central conduit 234 communicates with the mixing chamber 238 through an opening 242 in the fifth plate 236. The opening 242 may have a diameter less than, greater than or the same as a diameter of the central conduit 234. In the embodiment of FIG. 2B, the opening 242 has diameter the same as the central conduit 234.

The fourth plate 232 also includes inlets 244 and 246 that are adapted to provide gases to the mixing chamber 238. The inlet 244 is coupled to a first gas source 248 and the inlet 246 is coupled to a second gas source 250. The first gas source 248 and the second gas source 250 may include processing gases as well as inert gases, for example inert gases such as argon and/or helium, utilized as a carrier gas. The first gas source 248 may include ammonia (NH₃) as well as argon (Ar). The second gas source 250 may contain fluorine containing gases, hydrogen containing gases, or a combination thereof. In one example, the second gas source 250 may contain hydrogen fluoride (HF) as well as argon (Ar).

As illustrated in FIG. 2B, in some configurations, the inlet 244 is coupled to the mixing chamber 238 through a cylindrical channel 252 (shown in phantom) and holes 254 formed in the fifth plate 236. The inlet 246 is coupled to the mixing chamber 238 through a cylindrical channel 256 (shown in phantom) and holes 258 formed in the fifth plate 236. The holes 254, 258 formed in the fifth plate 236 are generally sized so that they enable a uniform flow of gases, which are provided from their respective gas source 248, 250, into the mixing chamber 238. In one configuration, the holes 258 have a diameter that is less than a width of the opening defined by the opposing sidewalls of the cylindrical channel 256 formed in the fourth plate 232. The holes 258 are typically distributed around the circumference of the center-line of the cylindrical channel 256 to provide uniform fluid flow into the mixing chamber 238. In one configuration, the holes 254 have a diameter that is less than a width of the opening defined by the opposing sidewalls of the cylindrical channel 252 formed the fourth plate 232. The holes 254 are typically distributed around the circumference of the center-line of the cylindrical channel 252 to provide uniform fluid flow into the mixing chamber 238.

The inlets 244 and 246 provide respective fluid flow paths laterally through the fourth plate 232, turning toward and penetrating through the fifth plate 236 to the mixing chamber 238. The lid assembly 204 also includes a seventh plate or first gas distributor 260, which may be a gas distribution plate, such as a showerhead, where the various gases mixed in the lid assembly 204 are flowed through perforations 262 formed therein. The perforations 262 are in fluid communication with the mixing chamber 238 to provide flow pathways from the mixing chamber 238 through the first gas distributor 260. Referring back to FIG. 2A, a blocker plate 264 and a second gas distributor 266, which may be a gas distribution plate, such as a showerhead, is disposed below the lid assembly 204.

Alternatively, a different cleaning process may be utilized to clean the substrate surface. For example, a remote plasma containing helium (He) and ammonia ($NH_3$) may be introduced into the processing chamber 200 through the lid assembly 204, while ammonia ($NH_3$) may be directly injected into the processing chamber 200 via a separate gas inlet 268 that is disposed at a side of the chamber body 202 and coupled to a gas source (not shown).

The support assembly 206 may include a substrate support 270 to support a substrate 272 thereon during processing. The substrate support 270 may be coupled to an actuator 274 by a shaft 276 which extends through a centrally-located opening formed in a bottom of the chamber body 202. The actuator 274 may be flexibly sealed to the chamber body 202 by bellows (not shown) that prevent vacuum leakage around the shaft 276. The actuator 274 allows the substrate support 270 to be moved vertically within the chamber body 202 between a processing position and a loading position. The loading position is slightly below the opening of a tunnel (not shown) formed in a sidewall of the chamber body 202.

The substrate support 270 has a flat, or a substantially flat, substrate supporting surface for supporting a substrate 272 to be processed thereon. The substrate support 270 may be moved vertically within the chamber body 202 by the actuator 274, which is coupled to the substrate support 270 by the shaft 276. For some process operations, the substrate support 270 may be elevated to a position in close proximity to the lid assembly 204 to control the temperature of the substrate 272 being processed. As such, the substrate 272 may be heated via radiation emitted from the second gas distributor 266, or another radiant source, or by convection or conduction from the second gas distributor 266 through an intervening gas. In some process steps, the substrate may be disposed on lift pins 278 to perform additional thermal processing operations, such as performing an annealing step.

Figure 3:
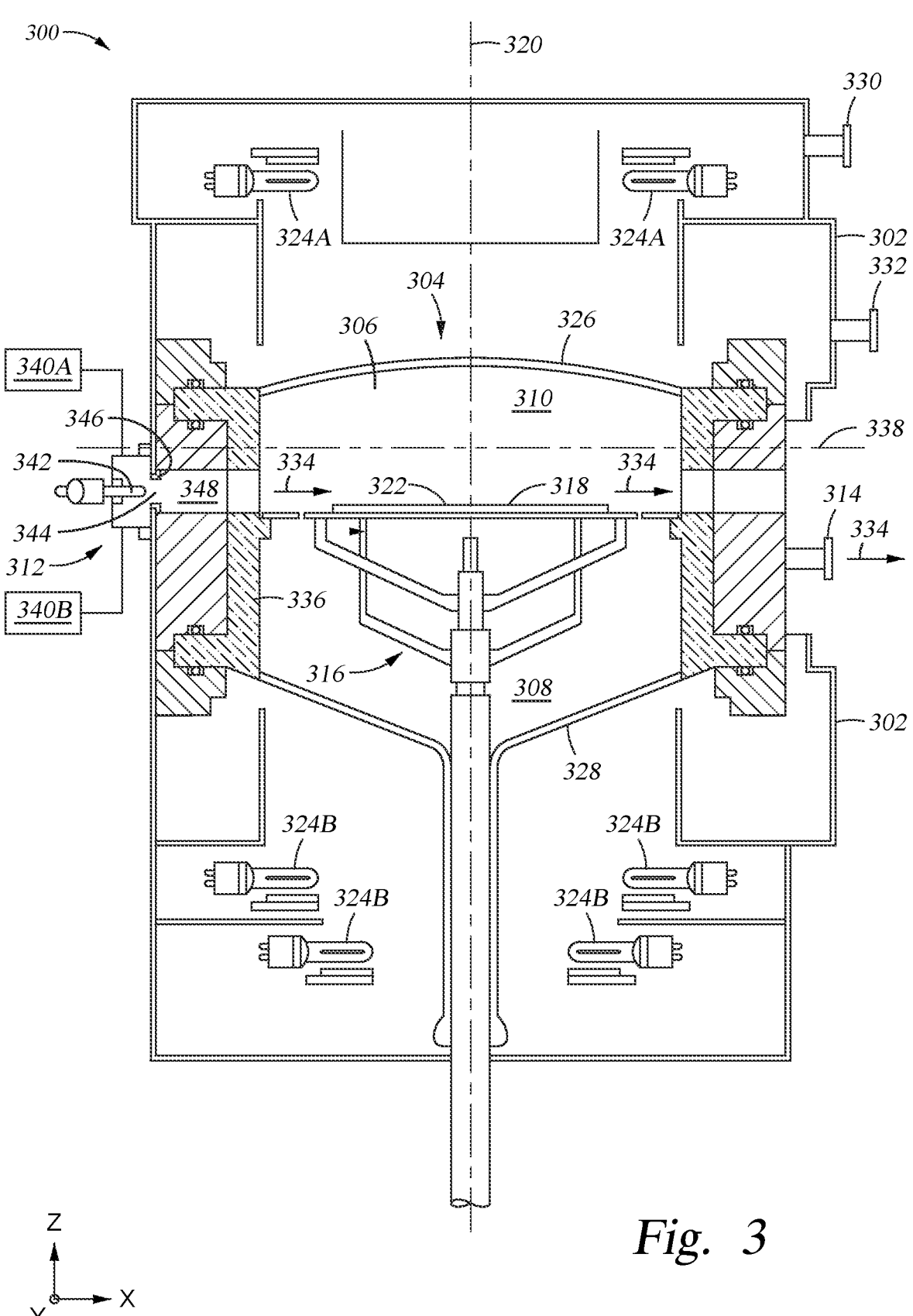
FIG. 3 is a cross sectional view of a processing chamber, according to one or more embodiments.

FIG. 3 is a cross sectional view of a processing chamber 300, according to one or more embodiments, that is adapted to perform an epitaxial (Epi) deposition process as detailed below. The processing chamber 300 may be the processing chamber 126, 128, or 130 shown in FIG. 1.

The processing chamber 300 includes a housing structure 302 made of a process resistant material, such as aluminum or stainless steel, for example 316L stainless steel. The housing structure 302 encloses various functioning elements of the processing chamber 300, such as a quartz chamber 304, which includes an upper quartz chamber 306, and a lower quartz chamber 308, in which a processing volume 310 is contained. Reactive species are provided to the quartz chamber 304 by a gas distribution assembly 312, and processing byproducts are removed from the processing volume 310 by an outlet port 314, which is typically in communication with a vacuum source (not shown).

A substrate support 316 is adapted to receive a substrate 318 that is transferred to the processing volume 310. The substrate support 316 is disposed along a longitudinal axis 320 of the processing chamber 300. The substrate support 316 may be made of a ceramic material or a graphite material coated with a silicon material, such as silicon carbide, or other process resistant material. Reactive species from precursor reactant materials are applied to a surface 322 of the substrate 318, and byproducts may be subsequently removed from the surface 322 of the substrate 318. Heating of the substrate 318 and/or the processing volume 310 may be provided by radiation sources, such as upper lamp modules 324A and lower lamp modules 324B.

In one embodiment, the upper lamp modules 324A and the lower lamp modules 324B are infrared (IR) lamps. Non-thermal energy or radiation from the lamp modules 324A and 324B travels through an upper quartz window 326 of the upper quartz chamber 306, and through a lower quartz window 328 of the lower quartz chamber 308. Cooling gases for the upper quartz chamber 306, if needed, enter through an inlet 330 and exit through an outlet 332. Precursor reactant materials, as well as diluent, purge and vent gases for the processing chamber 300, enter through the gas distribution assembly 312 and exit through the outlet port 314. While the upper quartz window 326 is shown as being curved or convex, the upper quartz window 326 may be planar or concave as the pressure on both sides of the upper quartz window 326 is substantially the same (i.e., atmospheric pressure).

The low wavelength radiation in the processing volume 310, which is used to energize reactive species and assist in adsorption of reactants and desorption of process byproducts from the surface 322 of the substrate 318, typically ranges from about 0.8 μm to about 1.2 μm, for example, between about 0.95 μm to about 1.05 μm, with combinations of various wavelengths being provided, depending, for example, on the composition of the film which is being epitaxially grown.

The component gases enter the processing volume 310 via the gas distribution assembly 312. Gas flows from the gas distribution assembly 312 and exits through the outlet port 314 as shown generally by a flow path 334. Combinations of component gases, which are used to clean/passivate a substrate surface, or to form the silicon and/or germanium-containing film that is being epitaxially grown, are typically mixed prior to entry into the processing volume 310. The overall pressure in the processing volume 310 may be adjusted by a valve (not shown) on the outlet port 314. At least a portion of the interior surface of the processing volume 310 is covered by a liner 336. In one embodiment, the liner 336 comprises a quartz material that is opaque. In this manner, the chamber wall is insulated from the heat in the processing volume 310.

The temperature of surfaces in the processing volume 310 may be controlled within a temperature range of about 200° C. to about 600° C., or greater, by the flow of a cooling gas, which enters through the inlet 330 and exits through the outlet 332, in combination with radiation from the upper lamp modules 324A positioned above the upper quartz window 326. The temperature in the lower quartz chamber 308 may be controlled within a temperature range of about 200° C. to about 600° C. or greater, by adjusting the speed of a blower unit which is not shown, and by radiation from the lower lamp modules 324B disposed below the lower quartz chamber 308. The pressure in the processing volume 310 may be between about 0.1 Torr to about 600 Torr, such as between about 5 Torr to about 30 Torr.

The temperature on the surface 322 of the substrate 318 may be controlled by power adjustment to the lower lamp modules 324B in the lower quartz chamber 308, or by power adjustment to both the upper lamp modules 324A overlying the upper quartz window 326, and the lower lamp modules 324B in the lower quartz chamber 308. The power density in the processing volume 310 may be between about 40 $W/cm^2$ to about 400 $W/cm^2$, such as about 80 $W/cm^2$ to about 120 $W/cm^2$.

In one aspect, the gas distribution assembly 312 is disposed normal to, or in a radial direction 338 relative to, the longitudinal axis 320 of the processing chamber 300 or the substrate 318. In this orientation, the gas distribution assembly 312 is adapted to flow process gases in the radial direction 338 across, or parallel to, the surface 322 of the substrate 318. In one processing application, the process gases are preheated at the point of introduction to the processing chamber 300 to initiate preheating of the gases prior to introduction to the processing volume 310, and/or to break specific bonds in the gases. In this manner, surface reaction kinetics may be modified independently from the thermal temperature of the substrate 318.

In operation, precursors used to form silicon (Si) and silicon germanium (SiGe) blanket or selective epitaxial films are provided to the gas distribution assembly 312 from one or more gas sources 340A and 340B. IR lamps 342 (only one is shown in FIG. 3) may be utilized to heat the precursors within the gas distribution assembly 312 as well as along the flow path 334. The gas sources 340A, 340B may be coupled the gas distribution assembly 312 in a manner adapted to facilitate introduction zones within the gas distribution assembly 312, such as a radial outer zone and a radial inner zone between the outer zones when viewed in from a top plan view. The gas sources 340A, 340B may include valves (not shown) to control the rate of introduction into the zones.

The gas sources 340A, 340B may include silicon precursors such as silanes, including silane ($SiH_4$), disilane ($Si_2H_6$,), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 340A, 340B may also include germanium containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 340A, 340B may include one or more of the silicon and germanium containing precursors in one or both of the gas sources 340A, 340B.

The precursor materials enter the processing volume 310 through openings or holes 344 (only one is shown in FIG. 3) in the perforated plate 346 in this excited state, which in one embodiment is a quartz material, having the holes 344 formed therethrough. The perforated plate 346 is transparent to IR energy, and may be made of a clear quartz material. In other embodiments, the perforated plate 346 may be any material that is transparent to IR energy and is resistant to process chemistry and other processing chemistries. The energized precursor materials flow toward the processing volume 310 through the holes 344 in the perforated plate 346, and through channels 348 (only one is shown in FIG. 3). A portion of the photons and non-thermal energy from the IR lamps 342 also passes through the holes 344, the perforated plate 346, and channels 348 facilitated by a reflective material and/or surface disposed on the interior surfaces of the gas distribution assembly 312, thereby illuminating the flow path 334 of the precursor materials. In this manner, the vibrational energy of the precursor materials may be maintained from the point of introduction to the processing volume 310 along the flow path.

Figure 4:
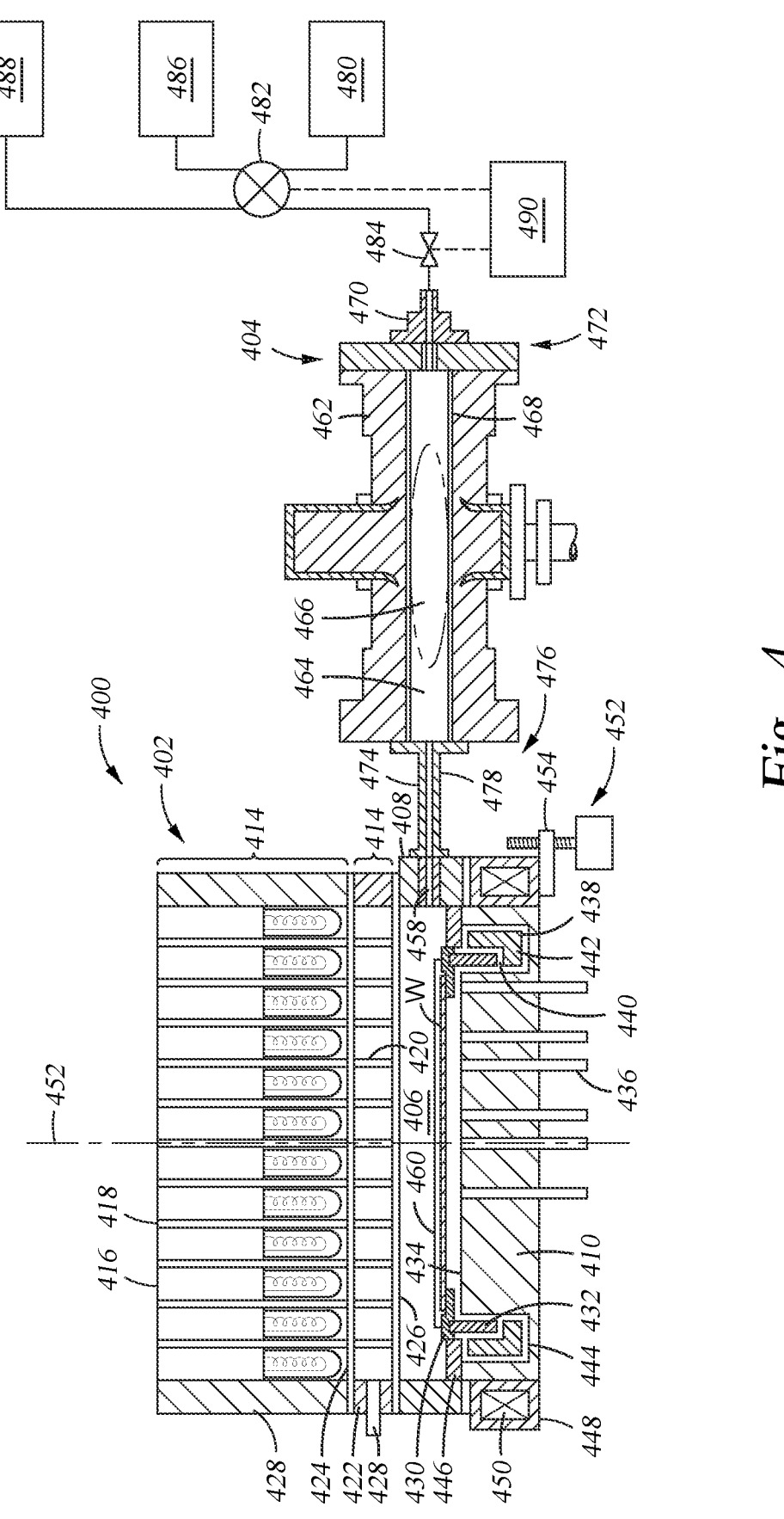
FIG. 4 is a cross sectional view of a processing system, according to one or more embodiments.

FIG. 4 is a cross sectional view of a processing system 400, according to one or more embodiments, that is adapted to perform a recrystallization anneal or an oxidation process as detailed below. The processing system 400 may be a rapid thermal processing (RTP) apparatus, such as, but not limited to, RTP CENTURA® available from Applied Materials, Inc., of Santa Clara, Calif. Other types of thermal reactors, such as EPI CENTURA® available from Applied Materials, Inc., of Santa Clara, Calif., may be substituted for the RTP apparatus. Other suitable plasma reactors, including Remote Plasma Oxidation (RPO) reactors available from Applied Materials, Inc., of Santa Clara, Calif., may also be utilized.

The processing system 400 includes a thermal processing chamber 402 and a precursor activator 404 that couples to the thermal processing chamber 402 and is used to remotely provide radicals of a plasma to a processing region 406 of the thermal processing chamber 402. The precursor activator 404 can also be used to provide an activated plasma gas mixture, for example by applying energy to a gas that makes a high radical rich mixture with negligible ions. The processing region 406 is enclosed by one or more sidewalls 408 (e.g., four sidewalls) and a base 410. The upper portion of the sidewall 408 may be sealed to a window assembly 412 (e.g., using "O" rings). A radiant energy assembly 414 is positioned over and coupled to window assembly 412. The radiant energy assembly 414 has a plurality of lamps 416, which may be tungsten halogen lamps, each mounted into a receptacle 418 and positioned to emit electromagnetic radiation into the processing region 406. The window assembly 412 of FIG. 4 has a plurality of light pipes 420, but the window assembly 412 may just have a flat, solid window with no light pipes. The window assembly 412 has an outer wall 422 (e.g., a cylindrical outer wall) that forms a rim enclosing the window assembly 412 around a circumference thereof. The window assembly 412 also has a first window 424 covering a first end of the plurality of light pipes 420 and a second window 426 covering a second end of the plurality of light pipes 420, opposite the first end. The first window 424 and second window 426 extend to, and engage with, the outer wall 422 of the window assembly 412 to enclose and seal the interior of the window assembly 412, which includes the plurality of light pipes 420. In such cases, when light pipes are used, a vacuum can be produced in the plurality of light pipes 420 by applying vacuum through a conduit 428 through the outer wall 422 to one of the plurality of light pipes 420, which is in turn fluidly connected to the rest of the light pipes.

A substrate W is supported in the thermal processing chamber 402 by a support ring 430 within the processing region 406. The support ring 430 is mounted on a rotatable cylinder 432. By rotating the rotatable cylinder 432, the support ring 430 and substrate W are caused to rotate during processing. The base 410 of the thermal processing chamber 402 has a reflective surface 434 for reflecting energy onto the backside of the substrate W during processing. Alternatively, a separate reflector (not shown) can be positioned between the base 410 of the thermal processing chamber 402 and the support ring 430. The thermal processing chamber 402 may include a plurality of temperature probes 436 disposed through the base 410 of the thermal processing chamber 402 to detect the temperature of the substrate W. In the event a separate reflector is used, as described above, the temperature probes 436 are also disposed through the separate reflector for optical access to electromagnetic radiation coming from the substrate W.

The rotatable cylinder 432 is supported by a magnetic rotor 438, which is a cylindrical member having a ledge 440 on which the rotatable cylinder 432 rests when both members are installed in the thermal processing chamber 402. The magnetic rotor 438 has a plurality of magnets in a magnet region 442 below the ledge 440. The magnetic rotor 438 is disposed in an annular well 444 located at a peripheral region of the thermal processing chamber 402 along the base 410. A cover 446 rests on a peripheral portion of the base 410 and extends over the annular well 444 toward the rotatable cylinder 432 and support ring 430, leaving a tolerance gap between the cover 446 and the rotatable cylinder 432 and/or the support ring 430. The cover 446 generally protects the magnetic rotor 438 from exposure to process conditions in the processing region 406.

The magnetic rotor 438 is rotated by magnetic energy from a magnetic stator 448 disposed around the base 410. The magnetic stator 448 has a plurality of electromagnets 450 that, during processing of the substrate W, are powered according to a rotating pattern to form a rotating magnetic field that provides magnetic energy to rotate the magnetic rotor 438. The magnetic stator 448 is coupled to a linear actuator 452 by a support 454. Operating the linear actuator 452 moves the magnetic stator 448 along an axis 456 of the thermal processing chamber 402, which in turn moves the magnetic rotor 438, the rotatable cylinder 432, the support ring 430, and the substrate W along the axis 456.

Processing gas is provided to the thermal processing chamber 402 through a chamber inlet 458, and exhausts through a chamber outlet oriented out of the page and generally along the same plane as the chamber inlet 458 and the support ring 430 (not shown in FIG. 4). Substrates enter and exit the thermal processing chamber 402 through an access port 460 formed in the sidewall 408 and shown at the rear in FIG. 4.

The precursor activator 404 has a body 462 surrounding an interior space 464 where a plasma 466 of ions, radicals, and electrons can be formed. A liner 468 made of quartz or sapphire protects the body 462 from chemical attack by the plasma. The interior space 464 preferably does not have any electrical potential gradient present that might attract charged particles, e.g., ions. A gas inlet 470 is disposed at a first end 472 of the body 462 and opposite from a gas outlet 474 that is located at a second end 476 of the body 462. When the precursor activator 404 is coupled to the thermal processing chamber 402, the gas outlet 474 is in fluid communication with the thermal processing chamber 402 through a delivery line 478 to chamber inlet 458, such that radicals of the plasma 466 generated within the interior space 464 are supplied to the processing region 406 of the thermal processing chamber 402. The gas outlet 474 may have a diameter larger than the gas inlet 470 to allow the excited radicals to be efficiently discharged at a targeted flow rate, and to minimize the contact between the radicals and the liner 468. If targeted, a separate orifice may be inserted within the liner 468 at the gas outlet 474 to reduce an inner dimension of the interior space 464 at the gas outlet 474. The diameter of the gas outlet 474 (or orifice, if used) can be selected to provide a pressure differential between the processing region 406 and the precursor activator 404. The pressure differential may be selected to yield a composition of ions, radicals, and molecules flowing into the thermal processing chamber 402 that is suitable to processes being performed in the thermal processing chamber 402.

To provide gas for plasma processing, a first gas source 480 is coupled to the gas inlet 470 via a first input of a four-way valve 482 and a valve 484 used to control the flow rate of gas released from the first gas source 480. A second input of the four-way valve 482 may be coupled to a second gas source 486. A third input of the four-way valve may be coupled to a third gas source 488. Each of the first gas source 480, the second gas source 486, and the third gas source 488 may be, or include, one or more of a nitrogen-containing gas, an oxygen-containing gas, a silicon-containing gas, a hydrogen-containing gas, or a plasma forming gas such as argon or helium. A flow controller 490 is connected to the four-way valve 482 to switch the valve between its different positions, depending upon which process is to be carried out. The flow controller 490 also controls switching of the four-way valve 482.

In some implementations, a second hydrogen gas source (not shown) is fluidly coupled with the thermal processing chamber 402. The second hydrogen gas source delivers hydrogen gas to the processing region 406 where the hydrogen gas is activated by the remote plasma comprising oxygen and argon delivered from the precursor activator 404 to the processing region 406. In some implementations where a high percentage of hydrogen gas is targeted, hydrogen gas may be supplied to the processing region 406 through both the third gas source 488 and the second hydrogen gas source.

In some implementations, a second argon gas source (not shown) is coupled with the thermal processing chamber 402. The second argon gas source delivers argon gas to the processing region 406 where the argon gas is activated by the remote plasma delivered from the precursor activator 404 to the processing region 406. In some implementations where a high percentage of argon gas is targeted, argon gas may be supplied to the processing region 406 through both the second gas source 486 and the second argon gas source.

Figure 5:
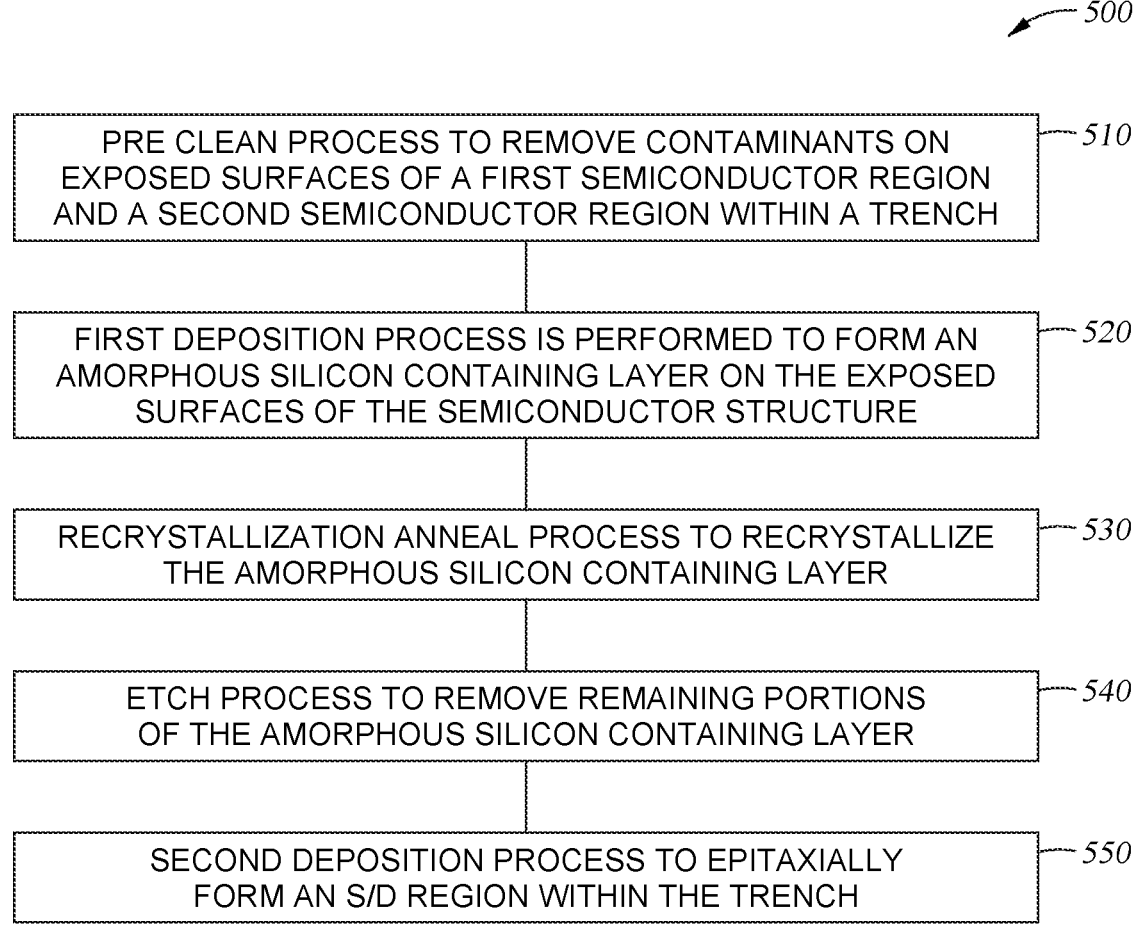
FIG. 5 depicts a process flow diagram of a method of forming a contact layer in a semiconductor structure according to a first embodiment of the present disclosure.

FIG. 5 depicts a process flow diagram of a method 500 of forming a source/drain region in a semiconductor structure 600 according to a first embodiment of the present disclosure. FIGS. 6A, 6B, 6C, 6D, and 6E are cross-sectional views of a portion of the semiconductor structure 600 corresponding to various states of the method 500. It should be understood that FIGS. 6A, 6B, 6C, 6D, and 6E illustrate only partial schematic views of the semiconductor structure 600, and the semiconductor structure 600 may contain any number of transistor sections and additional materials having aspects as illustrated in the figures. It should also be noted that although the method illustrated in FIG. 5 is described sequentially, other process sequences that include one or more operations that have been omitted and/or added, and/or has been rearranged in another desirable order, fall within the scope of the embodiments of the disclosure provided herein.

Referring to FIGS. 6A, 6B, 6C, 6D, and 6E, the semiconductor structure 600 may include a first semiconductor region 602 and a second semiconductor region 604 formed on a substrate 606. The first semiconductor region 602 and the second semiconductor region 604 are separated by a trench 608, in which a source/drain (SD) region is formed.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

Figure 6A:
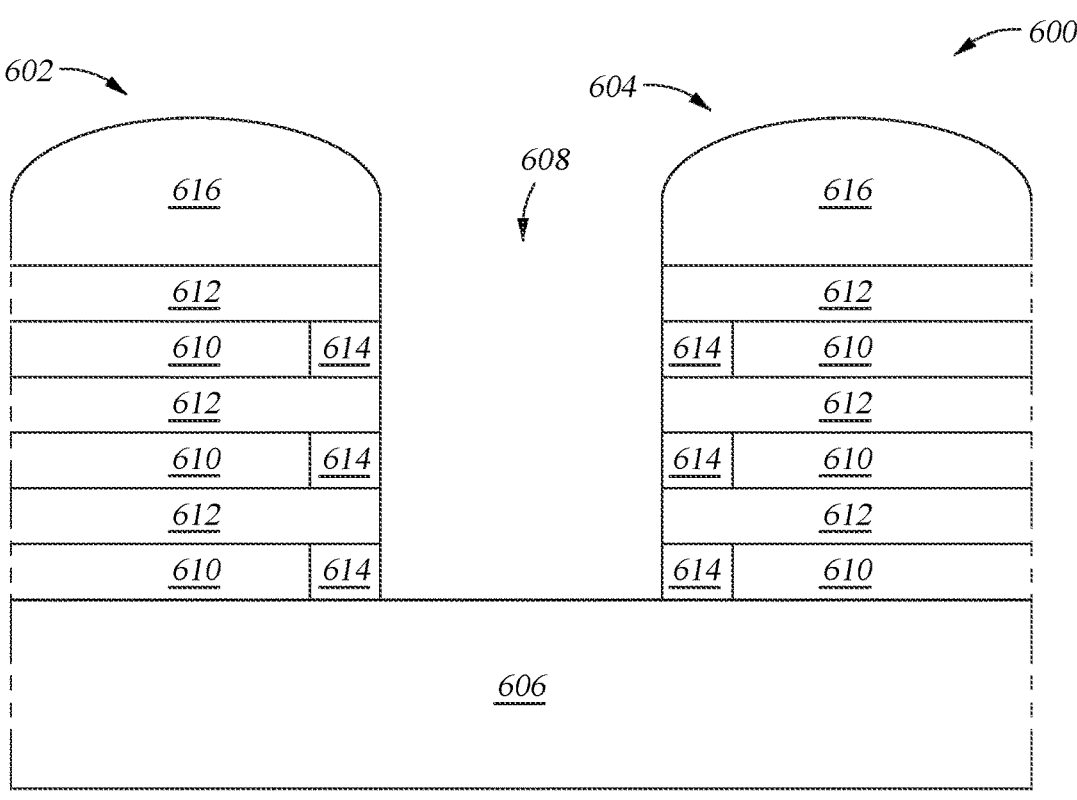
FIGS. 6A, 6B, 6C, 6D, and 6E are cross-sectional views of a portion of a semiconductor structure corresponding to various states of the method of FIG. 5.

As shown in FIG. 6A, the first semiconductor region 602 and the second semiconductor region 604 each include first semiconductor layers 610 and second semiconductor layers 612 that are alternately and repeatedly stacked on the substrate 606. The first semiconductor layers 610 are formed of a first material having etch selectivity to a second material of which the second semiconductor layers 612 are formed (i.e., an etch rate of the first material is higher than an etch rate of the second material). The etch selectivity (i.e., a ratio of the etch rate of the first material to the etch rate of the second material) is between about 10:1 to 200:1. Example combinations of the first material and the second material include silicon germanium (SiGe)/silicon (Si), silicon germanium (SiGe)/germanium (Ge), and germanium tin (GeSn)/silicon (Si). The first semiconductor layers 610 may be selectively etched to form indentations at an end of the first semiconductor layers 610 facing the trench 608, in each of which a spacer 614 is formed. These spacers 614 may be formed of dielectric material, such as silicon nitride ($Si_3N_4$), silicon oxynitride (SiON), or silicon oxycarbonitride (SiOCN).

The second semiconductor layers 612 may serve as channels having a width of between several nanometers and several tens of nanometers.

The first and second semiconductor layers 610 and 612 may be formed using any suitable deposition technique, such as chemical vapor deposition (CVD), atomic layer deposition (ALD), or physical vapor deposition (PVD), and the trench 608 is formed by a patterning technique, such as a lithography and etch process. The first and second semiconductor layers 610 and 612 may each have thickness of between about 3 nm and about 15 nm, for example, about 10 nm. The selective etching of the first semiconductor layers 610 may be performed by any appropriate etch process, such as a dry plasma etch process.

The semiconductor structure 600 further includes a dummy gate layer (also referred to as a "dielectric layer") 616 formed over at least a portion of each of the first semiconductor region 602 and the second semiconductor region 604. The dummy gate layer 616 may be formed of a dielectric material, such as silicon dioxide ($SiO_2$).

The method 500 begins with a pre-clean process in block 510. The pre-clean process may be performed in a processing chamber, such as the processing chamber 122 shown in FIG. 1, the processing chamber 200 shown in FIG. 2, or the processing chamber 300 shown in FIG. 3. In some embodiments, the pre-clean process in block 510 and the first deposition process in block 520 are performed in-situ in the same processing chamber, to minimize regrowth of oxide layers.

The pre-clean process is configured to remove contaminants, such as native oxide layers, or patterning residues (e.g., fluorocarbons) formed on the exposed surfaces of the first semiconductor region 602 and the second semiconductor region 604 within the trench 608.

The pre-clean etch process may be a wet etch process, using a cleaning solution, such as a hydrofluoric acid (HF)-last type cleaning solution, ozonated water cleaning solution, HF and hydrogen peroxide ($H_2O_2$) solution, and/or other suitable cleaning solution. The cleaning solution may be heated.

The pre-clean process may include an isotropic plasma etching process, such as a SiCoNi™ dry chemical etching process, using a plasma formed from a gas including ammonia ($NH_3$), nitrogen trifluoride ($NF_3$), hydrogen fluoride (HF), or a combination thereof, and a carrier gas, such as nitrogen ($N_2$), hydrogen ($H_2$), or a combination thereof. The dry chemical etching process is selective for oxide layers, and thus does not readily etch silicon, germanium, or nitride layers regardless of whether the layers are amorphous, crystalline or polycrystalline. Selectivity of the dry chemical etching process for oxide versus silicon or germanium is at least about 3:1, and usually 5:1 or better, sometimes 10:1. The dry chemical etching process is also highly selective of oxide versus nitride. The selectivity of the dry chemical etching process versus nitride is at least about 3:1, usually 5:1 or better, sometimes 10:1.

The pre-clean process may include an anisotropic remote plasma assisted dry etch process, such as a reactive ion etching (RIE) process, using a plasma formed from a gas including argon (Ar), helium (He), or a combination thereof. The plasma effluents directionally bombard and remove contaminants on the exposed surfaces of the first semiconductor region 602 and the second semiconductor region 604 within the trench 608.

The pre-clean process may include an inductively coupled plasma (ICP) etching process, using a plasma formed from a gas including chlorine ($Cl_2$) and hydrogen ($H_2$), and a carrier gas including argon (Ar) and helium (He). The ICP etching process is used to form deep ridges with smooth sidewalls in silicon.

Figure 6B:
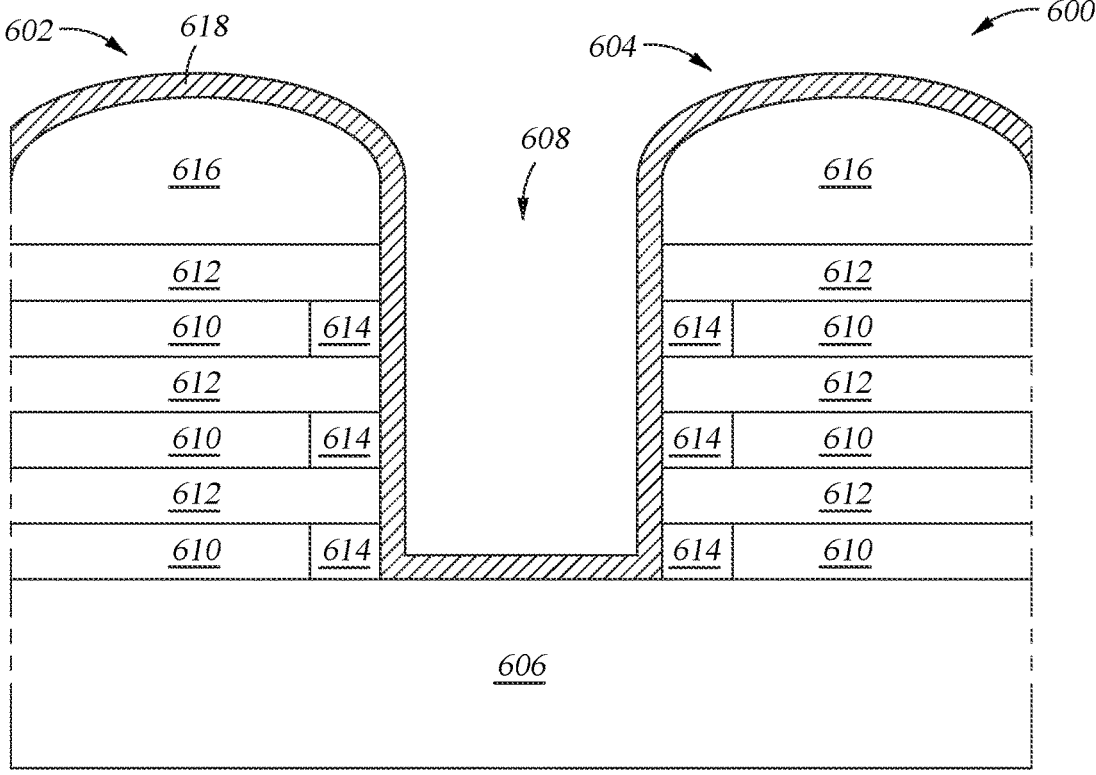

In block 520, a first deposition process is performed to form an amorphous silicon-containing layer 618 on the exposed surfaces of the semiconductor structure 600 (i.e., exposed surfaces of the first semiconductor region 602 and the second semiconductor region 604 within the trench 608, and the dummy gate layer 616), as shown in FIG. 6B. The first deposition process may include any appropriate deposition process, such plasma enhanced chemical vapor deposition (PECVD), low pressure chemical vapor deposition (LPCVD), epitaxy process, or the like, in a processing chamber, such as the processing chamber 126, 128, or 130 shown in FIG. 1, or the processing chamber 300 shown in FIG. 3.

The amorphous silicon-containing layer 618 may be doped with p-type dopants such as boron (B) or gallium (Ga), with the concentration of between about $10^{19}$ $cm^{-3}$ and about $5\times10^{21}$ $cm^{-3}$, depending upon the desired conductive characteristic of the S/D region to be formed in the trench 608. The p-type amorphous silicon-containing layer 618 may be formed of silicon germanium (SiGe) with a high germanium (Ge) concentration, for example, between about 5% and about 60%, in order to minimize parasitic resistance. The amorphous silicon-containing layer 618 may contain carbon (C) with a concentration of less than about 1%, which may be used for subsequent dopant diffusion control in the S/D region to be formed.

The amorphous silicon-containing layer 618 may be doped with n-type dopants such as phosphorus (P), antimony (Sb), with the concentration between about $10^{19}$ $cm^{-3}$ and $5\times10^{21}$ $cm^{-3}$, depending upon the desired conductive characteristic of the S/D region to be formed in the trench 608. The n-type amorphous silicon-containing layer 618 may be formed of silicon germanium (SiGe) with a low germanium (Ge) concentration, for example, less than about 5%, to promote recrystallization of the amorphous silicon-containing layer 618 in a subsequent recrystallization anneal process in block 530.

In the first deposition process, the semiconductor structure 600 is exposed to a silicon-containing deposition gas at a low temperature of between about 200° C. and about 500° C., to ensure the formed layer 618 is amorphous. The deposition gas includes a silicon-containing precursor, a germanium containing precursor, and a dopant source. The silicon-containing precursor may include silane ($SiH_4$), disilane ($Si_2H_6$), trisilane $Si_3H_8$, tetrasilane ($Si_4H_{10}$), methylsilane ($CH_6Si$), dimethylsilane ($C_2H_8Si$), or a combination thereof. The germanium-containing precursor may include germane ($GeH_4$), germanium tetrachloride ($GeCl_4$), and digermane ($Ge_2H_6$). To form an n-type amorphous silicon-containing layer 618, the dopant source may include n-type dopants such as phosphorus (P), antimony (Sb), arsenic (As). The dopant source may include a precursor phosphine ($PH_3$), phosphorus trichloride ($PCl_3$), triisobutylphosphine ($[(CH_3)_3C]_3P$), antimony trichloride ($SbCl_3$), $Sb(C_2H_5)_5$, arsine ($AsH_3$), arsenic trichloride ($AsCl_3$), tertiarybutylarsine ($AsC_4H_{11}$) To form a p-type amorphous silicon-containing layer 618, the dopant source may include p-type dopants such as boron (B), or gallium (Ga). The dopant source may include a precursor diborane ($B_2H_6$), or trimethylgallium $Ga(CH_3)_3$. It should be noted that dopants may enhance recrystallization of the amorphous silicon-containing layer 618 in a subsequent recrystallization process in block 530.

Figure 6C:
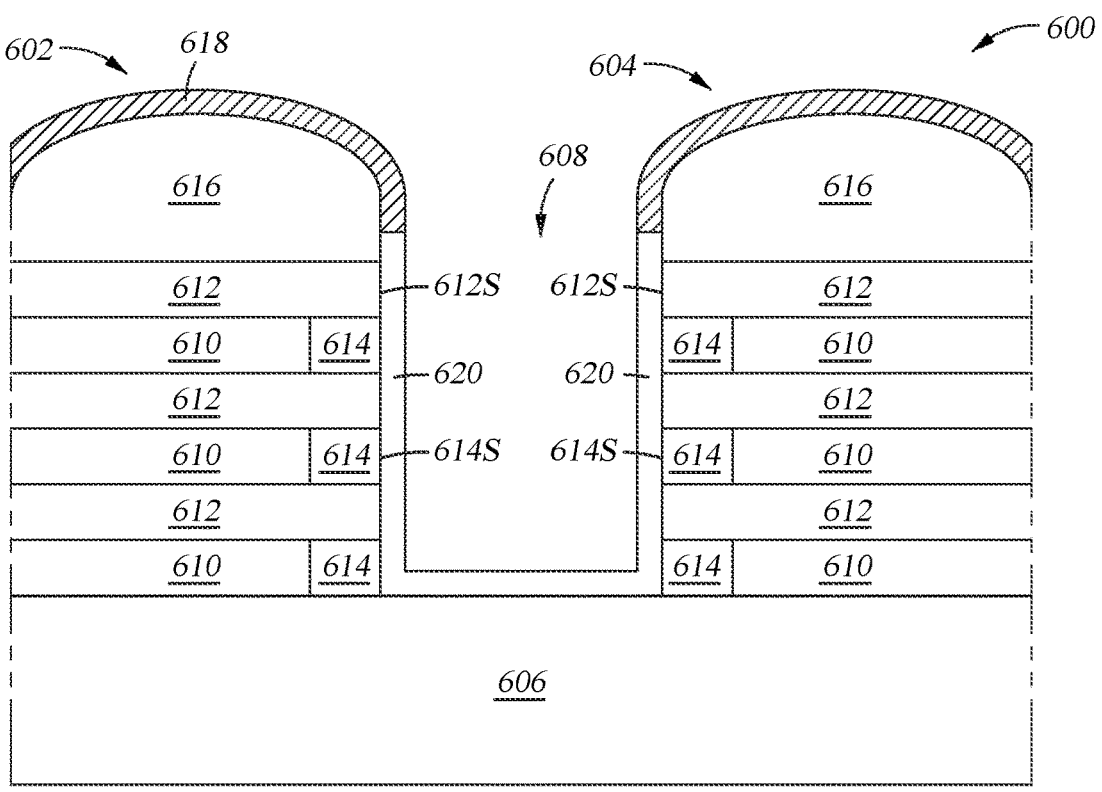

In block 530, a recrystallization anneal process is performed to recrystallize at least a portion of the amorphous silicon-containing layer 618, as shown in FIG. 6C. In some embodiments, the recrystallization anneal process is performed in-situ in the same chamber as a subsequent epitaxial deposition process in block 550, such as the processing chamber 300 shown in FIG. 3. In some other embodiments, the recrystallization anneal process is a rapid thermal anneal process and performed ex-situ in a rapid thermal processing (RTP) apparatus, such as the processing system 400 shown in FIG. 4. The recrystallization anneal process may be a laser anneal process.

The recrystallization anneal process may be performed at a temperature of between about 400° C. and about 700° C., for a duration of between about 1 minutes and about 15 minutes, or at a temperature of between about 700° C. and about 900° C., for a duration of milliseconds. In some embodiments, the temperature is fixed at, for example, about 600° C. for the duration of thermal annealing. In some embodiments, the temperature ramps up from, from example, about 300° C., to for about 600° C., and subsequently ramps back down to about 300° C., and this temperature change is repeated for the duration of thermal annealing.

During the recrystallization anneal process, the amorphous silicon-containing layer 618 crystalizes starting at surfaces 612S of the second semiconductor layers 612 (e.g., silicon (Si)) facing the trench 608, continues laterally along the width of the trench 608, and vertically along the length of the trench 608 over surfaces 614S of the spacers 614 facing the trench 608. Portions of the amorphous silicon-containing layer 618 thus crystalize and form a silicon-containing crystalline layer 620 within the trench 608, covering the surfaces 612S of the second semiconductor layers 612 and the surfaces 614S of the spacers 614. Portions of the amorphous silicon-containing layer 618 over the dummy gate layer 616 (e.g., silicon dioxide ($SiO_2$)) remain amorphous.

Figure 6D:
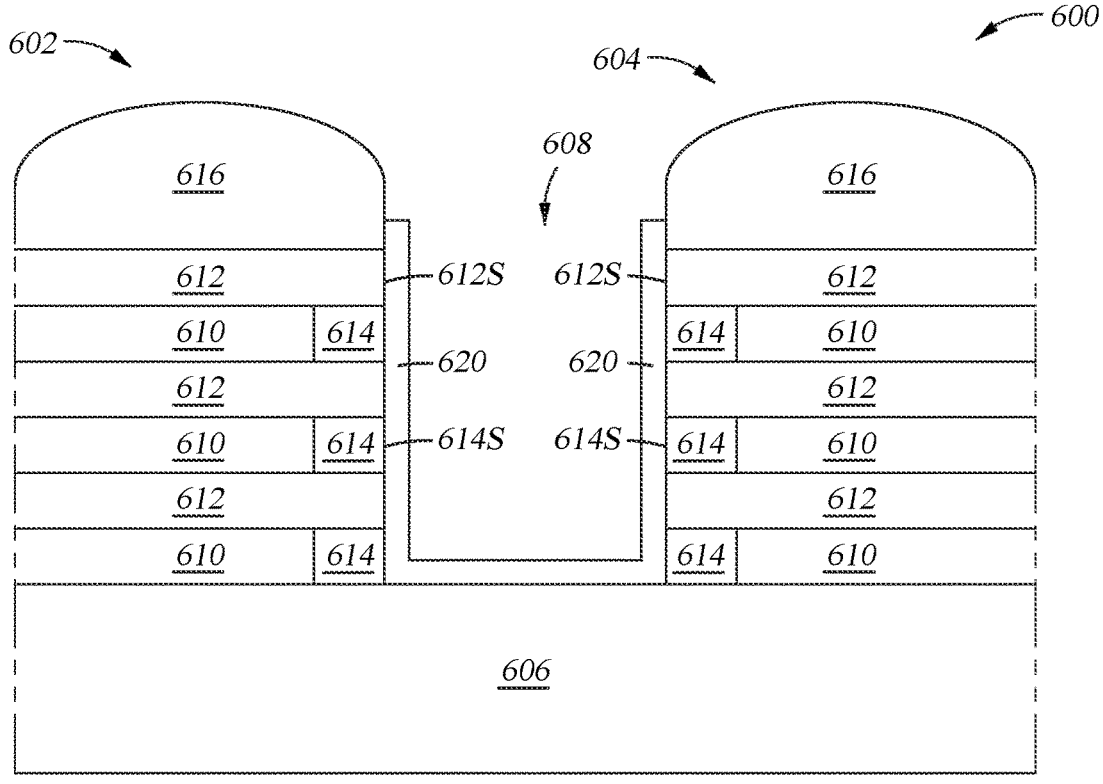

In block 540, an etch process is performed to remove remaining portions of the amorphous silicon-containing layer 618, as shown in FIG. 6D. The etch process may include any appropriate etch process and be performed in-situ in the same chamber as the subsequent epitaxial deposition process in block 550, such as the processing chamber 300 shown in FIG. 3. In some embodiments, the etch process may be performed ex-situ in a different processing chamber, such as the processing chamber 122 shown in FIG. 1, from the processing chamber in which the subsequent epitaxial deposition process in block 550. In these embodiments, the etch process is followed by a pre-clean process as in block 510 prior to the subsequent epitaxial deposition process in block 550.

In the etch process, the portions of the amorphous silicon-containing layer 618 over the dummy gate layer 616 (e.g., silicon dioxide ($SiO_2$)) and any portions the amorphous silicon-containing layer 618 that are not crystallized during the recrystallization anneal process in block 530 are removed, by an appropriate etching gas. The amorphous silicon-containing layer 618 can be etched at a faster rate than the silicon-containing crystalline layer 620, and thus can be etched selectively to the silicon-containing crystalline layer 620. The etch process in block 540 may also remove polycrystalline or defective material, if any.

Figure 6E:
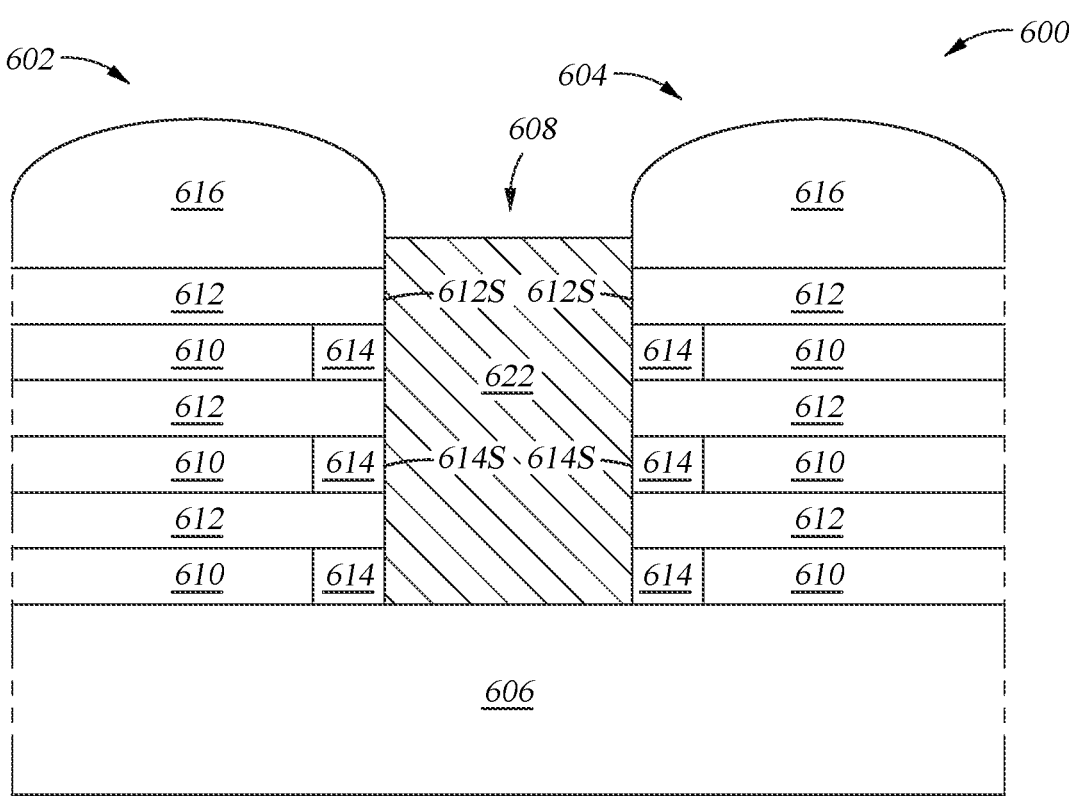

In block 550, a second deposition process is performed to epitaxially form an S/D region 622 within the trench 608, as shown in FIG. 6E. The second deposition process may include an epitaxial deposition process in a processing chamber, such as the processing chamber 126, 128, or 130 shown in FIG. 1, or the processing chamber 300 shown in FIG. 3.

The S/D region 622 is formed of the same material as the silicon-containing crystalline layer 620, and thus amorphous silicon-containing layer 618. In the second deposition process, the silicon-containing crystalline layer 620 is used as a crystalline template for epitaxial growth of the S/D region 622. The S/D region 622 formed in block 550 may thus be uniform having high quality without twins or stacking faults.

The epitaxial deposition process may be performed at a temperature of between about 400° C. and about 700° C. and at a pressure of between 5 Torr and 300 Torr.

The embodiments described herein provide methods and system for epitaxially growth to fill a trench in a semiconductor structure, wherein inner surfaces of the trench include silicon-containing portions and silicon nitride-containing portions. The epitaxial growth, according to the embodiments described herein, of a source/drain region is over a crystalline template formed on the surfaces of the trench, covering the silicon-containing portions and silicon nitride-containing portions, and thus the formed source/drain region is uniform having high quality without defects or voids. The crystalline template is formed by recrystallizing an amorphous silicon-containing layer disposed on the inner surfaces of the trench.

While the foregoing is directed to embodiments of the present disclosure, other and further embodiments of the disclosure may be devised without departing from the basic scope thereof, and the scope thereof is determined by the claims that follow.

The invention claimed is:

1. A method of filling a trench in a semiconductor structure, comprising:

performing a first deposition process to form an amorphous silicon-containing layer on exposed surfaces of a semiconductor structure, the semiconductor structure comprising a first semiconductor region, a second semiconductor region separated from the first semiconductor region by a trench, and a dielectric layer over at least a portion of the first semiconductor region and the second semiconductor region;

performing a recrystallization anneal process to recrystallize portions of the amorphous silicon-containing layer in direct contact with the first semiconductor region and the second semiconductor region to form a silicon-containing crystalline layer in direct contact with the first semiconductor region and the second semiconductor region within the trench;

performing an etch process to remove portions of the amorphous silicon-containing layer in direct contact with the dielectric layer; and performing a second deposition process, to epitaxially form a source/drain region over the silicon-containing crystalline layer within the trench.

2. The method of claim 1, wherein the first deposition process is performed at a temperature of between 200° C. and 500° C.

3. The method of claim 1, wherein the recrystallization anneal process is performed at a temperature of between 400° C. and 700° C.

4. The method of claim 1, wherein the amorphous silicon-containing layer, the silicon-containing crystalline layer, and the source/drain region are doped with n-type dopants.

5. The method of claim 1, wherein the amorphous silicon-containing layer, the silicon-containing crystalline layer, and the source/drain region are doped with p-type dopants.

6. The method of claim 1, wherein each of the first semiconductor region and the second semiconductor region comprises first semiconductor layers and second semiconductor layers that are alternately and repeatedly stacked, and each of the first semiconductor layers comprises a spacer at an end of the each of the first semiconductor layers facing the trench.

7. The method of claim 6, wherein the first semiconductor layers comprise silicon (Si), the second semiconductor layers comprise silicon germanium (SiGe), and the spacer comprises dielectric material selected from the group consisting of silicon nitride ($Si_3N_4$), silicon oxynitride (SiON), and silicon oxycarbonitride (SiOCN).

8. The method of claim 1, further comprising:

prior to the first deposition process, performing a pre-clean process on the exposed surfaces of the semiconductor structure.

9. A method of filling a trench in a semiconductor structure, comprising:

performing a pre-clean process on exposed surfaces of a semiconductor structure, the semiconductor structure comprising a first semiconductor region, a second semiconductor region separated from the first semiconductor region by a trench, and a dielectric layer over at least a portion of the first semiconductor region and the second semiconductor region;

performing a first deposition process to form an amorphous silicon-containing layer on the exposed surfaces of the semiconductor structure;

performing a recrystallization anneal process to recrystallize portions of the amorphous silicon-containing layer in direct contact with the first semiconductor region and the second semiconductor region to form a silicon-containing crystalline layer in direct contact with the first semiconductor region and the second semiconductor region within the trench;

performing an etch process to remove remaining portions of the amorphous silicon-containing layer in direct contact with the dielectric layer; and performing a second deposition process, to epitaxially form a source/drain region over the silicon-containing crystalline layer within the trench.

10. The method of claim 9, wherein the first deposition process is performed at a temperature of between 200° C. and 500° C.

11. The method of claim 9, wherein the recrystallization anneal process is performed at a temperature of between 400° C. and 700° C.

12. The method of claim 9, wherein the amorphous silicon-containing layer, the silicon-containing crystalline layer, and the source/drain region are doped with n-type dopants.

13. The method of claim 9, wherein the amorphous silicon-containing layer, the silicon-containing crystalline layer, and the source/drain region are doped with p-type dopants.

14. The method of claim 9, wherein each of the first semiconductor region and the second semiconductor region comprises first semiconductor layers and second semiconductor layers that are alternately and repeatedly stacked, each of the first semiconductor layers comprises a spacer at an end of the each of the first semiconductor layers facing the trench, the first semiconductor layers comprise silicon (Si), the second semiconductor layers comprise silicon germanium (SiGe), and the spacer comprises dielectric material selected from the group consisting of silicon nitride ($Si_3N_4$), silicon oxynitride (SiON), and silicon oxycarbonitride (SiOCN).

* * * * *